United States Patent [19]

Gwin

[11] Patent Number: 5,372,649
[45] Date of Patent: Dec. 13, 1994

[54] APPARATUS FOR WEIGHTING A DIFFUSION FURNACE CANTILEVER

[75] Inventor: Jon A. Gwin, San Antonio, Tex.

[73] Assignee: Sony Electronics, Inc., Park Ridge, N.J.

[21] Appl. No.: 113,521

[22] Filed: Aug. 30, 1993

Related U.S. Application Data

[63] Continuation of Ser. No. 864,416, Apr. 6, 1992, abandoned.

[51] Int. Cl.5 ............................................. B05C 13/02
[52] U.S. Cl. .................................. 118/728; 118/726; 211/41; 437/247
[58] Field of Search ..................... 118/726, 728, 729

[56] References Cited

U.S. PATENT DOCUMENTS

| | | | |
|---|---|---|---|
| 4,484,538 | 11/1984 | Sarkozy et al. | 118/729 |
| 4,579,609 | 4/1986 | Reif et al. | 437/171 |
| 4,653,650 | 3/1987 | Schulke | 211/41 |
| 4,699,805 | 10/1987 | Seelbach et al. | 118/733 |
| 4,822,756 | 4/1989 | Hirayama | 437/939 |

Primary Examiner—Anthony McFarlane

[57] ABSTRACT

Apparatus for counterweighting a diffusion furnace cantilever arm for processing silicon wafers which has conventional slotted quartz boats for receiving silicon wafers wherein certain substitutes for said conventional quartz boats are constructed so as to be dummy loads which have the weight and dimensions of a filled quartz boat, but in which no silicon wafers are mounted. Other quartz boats have slots for a particular number of silicon wafers, but the remaining portion of the boat does not receive any wafers, and the boat has the weight and dimensions equivalent to a filled quartz boat. By combining the various boats on the cantilever arm a standard weight can be obtained.

4 Claims, 2 Drawing Sheets

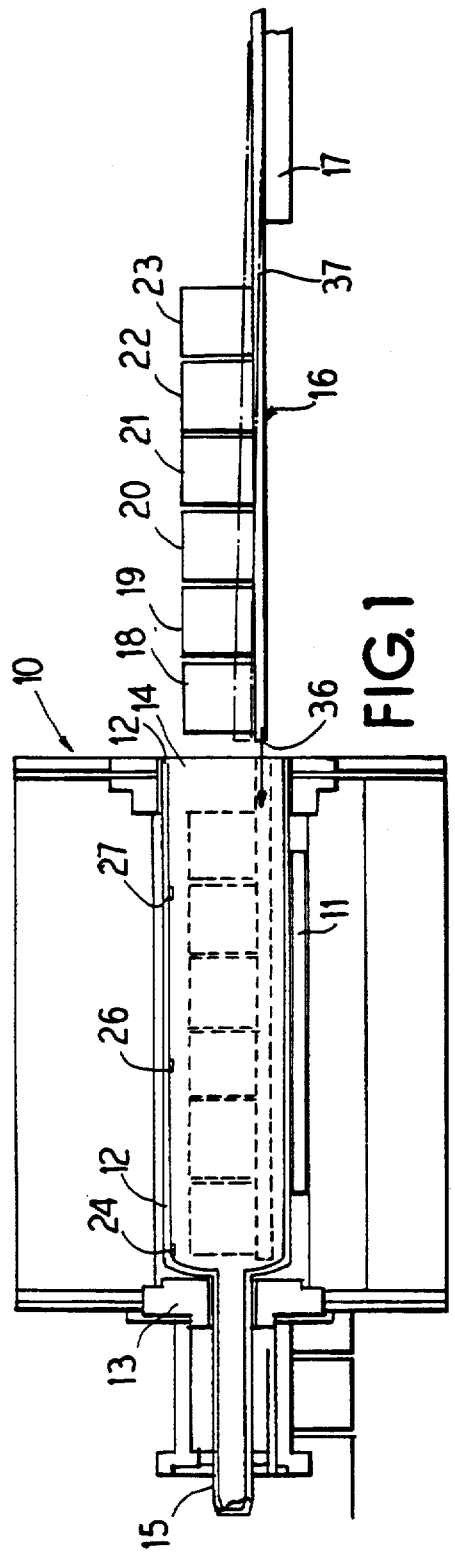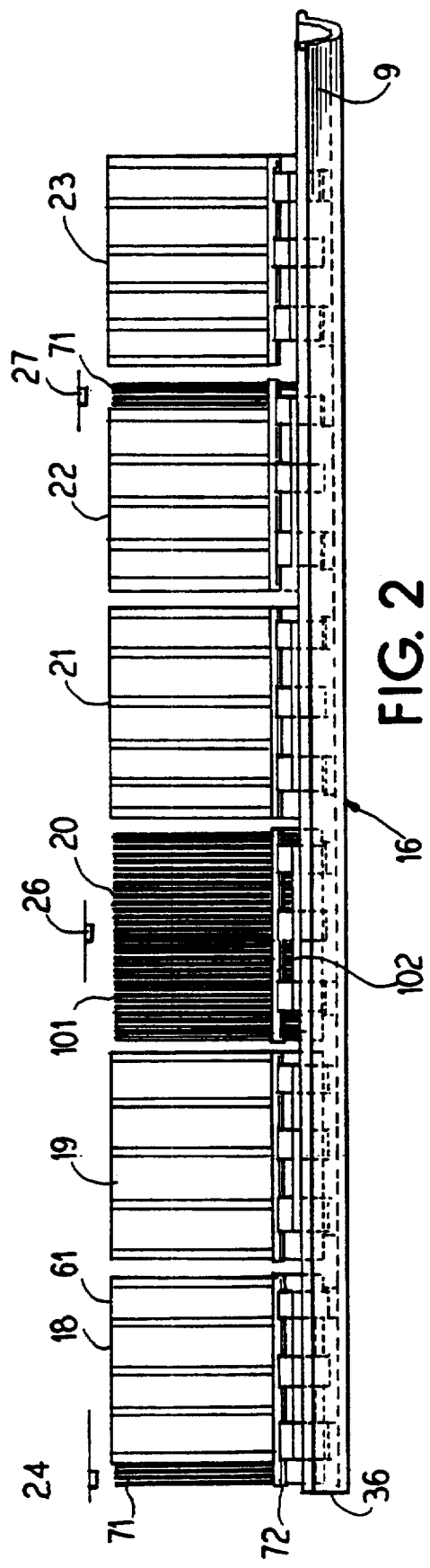

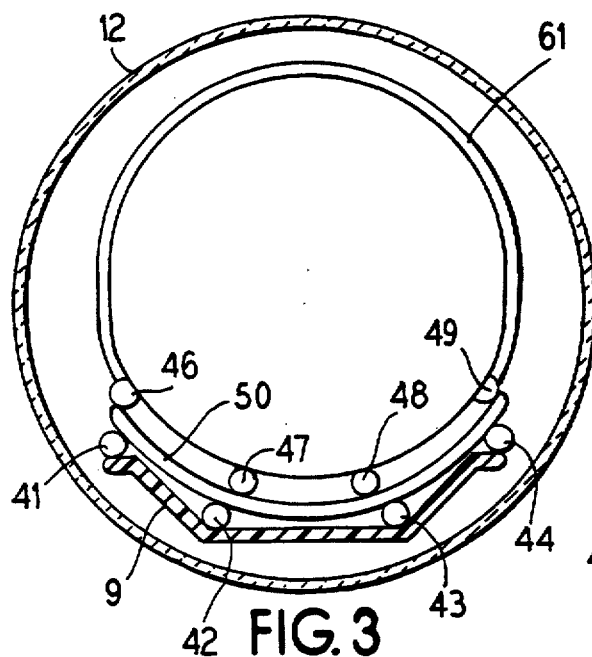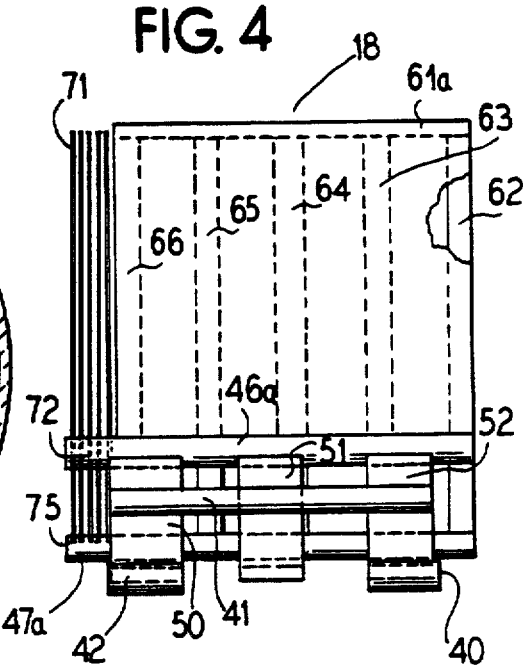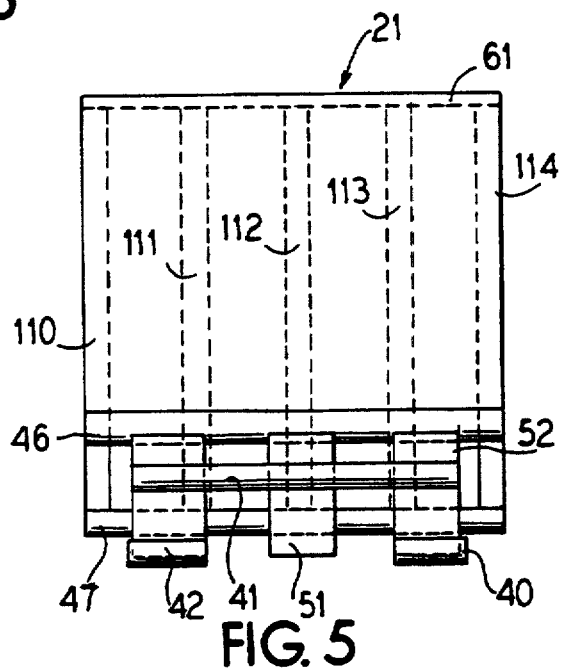

APPARATUS FOR WEIGHTING A DIFFUSION FURNACE CANTILEVER

This is a continuation of application Ser. No. 07/864,416, filed Apr. 6, 1992, now abandoned.

BACKGROUND OF THE INVENTION

1. Field of the Invention

This invention relates in general to apparatus and methods for processing of semiconductor wafers in a diffusion furnace during a diffusion process and in particular relates to the method and apparatus for weighting a cantilever arm during processing of semiconductor wafers.

2. Description of Related Art

In processing semiconductor wafers in diffusion furnaces, the wafers have been inserted into a series of conventional quartz boats which are provided with slots for mounting the disc shaped wafers parallel to each other. The boats are then placed onto a cantilever arm which moves them into a diffusion furnace. So that the cantilever arm, boats and wafers clear the mouth and inner walls of the diffusion furnace and thus prevents damage to the semiconductor wafers, a suspension system is provided so as to support the cantilever arm for a standard deflection based on the weight of the boats and the wafers on the cantilever arm. Thus, the cantilever and suspension system are designed to support a fixed weight of boats and semiconductor wafers.

At times it is required to process less than the maximum number of semiconductor wafers and in the prior art it has been common to load boats in which the maximum number of semiconductor waters are not required with dummy wafers as a substitute so as to arrive at standard weight for the boats and wafers. For example, in the prior art, if six boats each capable of storing up to 50 wafers are utilized on the cantilever arm and less than 300 semiconductor wafers are to be manufactured then the empty spaces are filled with silicon dummy wafers. For example, if 200 semiconductor wafers are to be manufactured, 100 dummy wafers would be inserted to provide a load of 300 semiconductor wafers and the dummy wafers serve as weight substituted for products on the system.

In the prior art systems, it is desireable and necessary to inspect the quality of the semiconductor end product during a diffusion process and the load is monitored at several predetermined points within the series of boats. For example, in one particular arrangement, monitoring occurs at three points within the furnace and at selected points in three of the boats. The monitor wafers must be positioned at the preset points so that the monitor system can verify the quality of the manufacturing process across the entire product zone.

The prior art system of utilizing dummy wafers is expensive and a great deal of time is required to load and unload dummy wafers. The cost of dummy wafers also are an additional expense in the manufacturing process. The use of dummy wafers as weights requires additional storage space, cleaning, scribing, tracking and inspection which is unproductive. Also, dummy wafers can result in dopant cross-contamination and particulate generation.

SUMMARY OF THE INVENTION

The present invention reduces the cost of processing of semiconductor wafer loads and utilizes a new technique so as to equally compensate for the substituted weight required by a partial load and substantially reduces the use of dummy wafers.

In the invention, conventional quartz boats that normally contain a full load of semiconductor wafers are modified with quartz discs and a circular quartz outer shell which replicates the weight and dimensions of a prior art quartz boat filled with semiconductor wafers. The invention also provides an alternative type of boat which is capable of containing a partial load of wafers which are to be processed and wherein the remaining portion comprises quartz discs and a circular quartz outer shell such that when the partial load of wafers is loaded the boat has dimensions and weight equal to a prior art quartz boat filled with semiconductor wafers.

By utilizing a combination of the prior art boats, wafers, quartz baffles and slotted quartz baffles the load can be placed on the cantilever arm that will maintain the desired fixed deflection, allow monitoring of the process at the desired locations and maintain the gas flow characteristics within the furnace as did the prior art loaded boats.

It is an object of the invention to provide a novel apparatus and method for loading a cantilever arm of a diffusion furnace so that standard deflection characteristics, gas flow and monitoring can be maintained.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 1 is a side partially sectional view of a diffusion furnace and the cantilever support of the invention;

FIG. 2 is an enlarged side view of a cantilever arm of the invention illustrating a number of boats mounted thereon;

FIG. 3 is an sectional view illustrating the invention and cantilever arm inside a furnace tube;

FIG. 4 illustrates a slotted quartz baffle arrangement which can receive a partial load of semiconductor wafers and which has a weight equal to the weight of a loaded conventional boat; and FIG. 5 illustrates a quartz baffle arrangement which receives no semiconductor wafers to be processed but which has the weight of a full load of wafers.

DETAILED DESCRIPTION OF THE PREFERRED EMBODIMENTS

FIG. 1 illustrates a diffusion furnace 10 which has a heater 11 and a cylindrical chamber 12 to which a gas tube 15 is connected. An open end 8 of the chamber 12 receives a cantilever arm 16 upon which boats 18, 19, 20, 21, 22 and 23 are mounted. A support 17 supports the cantilever arm 16 adjacent the end 37. The free end 36 of the cantilever arm 16 is first received within the chamber 12 and if the weight of the boats 18–23 is appropriate, the boats and the cantilever arm 16 will not contact the walls of the chamber 12. The dot-dashed lines illustrate the position of the cantilever arm 16 with no weight or boats mounted thereon. Spaced sensors 24, 26 and 27 are mounted within the chamber 12 at precise locations so as to monitor the conditions within the furnace.

FIG. 2 is a plan side view of the cantilever arm 16. The cantilever arm 16 comprises a channel shape member 9 as illustrated in FIG. 3 into which the boats 18, 19, 20 21, 22 and 23 are received.

FIG. 2 illustrates a conventional boat 20 of the prior art which is created for receiving 50 silicon wafers mounted therein which are received in holding slots 102 of the boat 20.

The novel quartz baffles of the present invention comprise the boats such as 19, 21 and 23 in which no silicon wafers are mounted and which are constructed so as to each have the weight and dimensions of a conventional boat filled with 50 wafers. Another form of the invention comprises the slotted quartz baffle boats 18 and 22 which have slots for wafers at one end thereof and wherein the remaining portion of the boat is fabricated with the same dimensions and so that the total weight is equal to a 50 wafer filled conventional boat when the number of slots at the end of the boat are filled with wafers.

FIG. 3 is an end view of the boats and FIG. 4 is a side plan view of a slotted quartz baffle such as boat 18 (or 22) and FIG. 5 is a side plan view of a quartz baffle such as boat 21 (19, 23). The quartz baffles and the slotted quartz baffles rest upon four longitudinally extending rods 41, 42, 43 and 44 which rest on the supporting cantilever arm 9. Spaced crescent-shaped members 50, 51, and 52 are attached to the rods 41, 42, 43 and 44 as shown in FIG. 3 and longitudinal rods 46, 47, 48 and 49 are attached to the upper surface of the crescent-shape members 50. A generally cylindrical cover member 61 is attached to the rods 46, 47, 48 and 49. In the quartz baffle such as 19, 21, and 23 the cover member 61 extends for the full length of the quartz baffle.

In the quartz baffles 19, 21 and 23 which contain no semiconductor wafers that are to be treated, as shown in FIG. 5, five disc shaped members 110, 111, 112, 113 and 114 are equally spaced and are mounted on the rods 46, 47, 48 and 49 and the cylindrical-shape cover member 61 is attached thereto so as to form the quartz baffle structure. The composite structure of the quartz baffle 21 is formed so that it has the same weight as a loaded boat 20 which includes, for example, 50 semiconductor wafers which are to be treated. Thus, the quartz baffle 21 can be substituted for a loaded boat 20 and has the same weight and when on the cantilever arm 16 will bias it downwardly the same amount that a full boat 20 would.

A second form of the boat of the invention comprises a slotted quartz baffle such as illustrated in FIG. 4 wherein five discs 62, 63, 64 and 65 and 66 are attached to the rods 46a, 47a, 48a, and 49a with the disc 62 mounted at one end of the slotted quartz baffle and the disc 66 spaced inwardly from the end of the slotted quartz baffle by a space equivalent to the space required to mount five silicon wafers. The cover 61a extends over the discs 62 through 66. The longitudinal rods 46a and 47a are formed with slots 72 and 75 so that silicon wafers 71 can be mounted at the end of the slotted quartz baffle 18 as illustrated in FIG. 4. The slotted quartz baffle 18 when loaded with five wafers 71 has the same weight as a conventional boat 20 loaded with 50 wafers.

The slotted quartz baffle 18 is shown in FIG. 2 mounted on the cantilever arm 16 with the wafers 71 on the left end. Slotted quartz baffle 22 is identical to the slotted quartz baffle 18 except that the wafers 71 have been mounted on the right end of slotted quartz baffle 22 which means that the slotted quartz baffle 22 is reversed 180° relative to the slotted quartz baffle 18.

In view of the requirement to monitor the quality of the semiconductor product during a diffusion process, the replacement of standard boats with quartz baffles and slotted quartz baffles according to the invention is dependent on the size of the partial load. For any combination of product wafers to be processed a combination of conventional boats 20 and quartz baffles such as 19, 21 and 23 which hold no wafers and/or slotted quartz baffles such as 18 and 22 which have end receptacles for five wafers can be utilized. For some quantities of wafers dummy wafers might still be required when a boat such as 20 was utilized and the unused slots in the boat 20 would be filled with dummy wafers. In any event, a substantially smaller number of dummy wafers would be required when using the quartz baffles and slotted quartz baffles of the invention than would be required when using the prior art boats 20 in which all of the empty slots must be filled with dummy wafers.

In the example given, and shown in FIG. 2, a cantilever arm 16 adapted to hold three hundred wafers is illustrated which uses six boats and each of the boats is of a size so as to support 50 wafers. Also with 300 wafers, monitoring positions of the monitors 24, 26 and 27 are established. It is to be realized that this example is for illustrative purposes only and the invention is applicable to cantilever arms adapted to support more or less than 300 wafers. In a particular embodiment constructed according to the invention six aligned boats or baffles are mounted on a cantilever arm. The boats are numbered from the rear of the furnace 1 to 6. Actual product are never processed on boat number 6 so a quartz baffle; 19 may be used at this position. A boat full of wafers such as 20 would be mounted at position three in the furnace which is the furnace "sweet spot". Either full boats such as 20 or slotted quartz baffles such as 18 and 22 would be mounted in positions one and five of the furnace so that the monitors 24 and 27 can monitor the wafers mounted therein. Positions two and four would be filled with either quartz baffles or full boats as required.

The quartz baffles and the slotted quartz baffles may be made of quartz which can be easily cleaned and can be easily stored.

The invention prevents contact with the furnace which can cause particulate which is undesired. Also the weight, gas flow characteristics and mass distribution is very favorable when using the invention.

It is seen that this invention provides novel boats for loading a cantilever arm of a diffusion furnace and although the invention has been described with respect to preferred embodiments, it is not to be so limited as changes and modifications can be made which are within the full intended scope of the invention as defined by the appended claims.

We claim as our invention:

1. Apparatus for counterweighting a diffusion furnace cantilever arm which is inserted into the furnace for processing semiconductor wafers, said apparatus including a novel empty boat and other boats which contain a full load of wafers, where said empty boats provide a means for balancing the cantilever arm, said empty novel boat has a cylindrical outer cover and is empty of any semiconductor wafers, and said novel boat provides a means for balancing with other boats which contain a full load of wafers and said empty novel boat has the same weight as one of said other boats which contain a full load of wafers so that one or more of said novel empty boats is mounted on a cantilever arm with other boars which contain wafers as a balancing mechanism.

2. Apparatus for counterweighting a diffusion furnace cantilever arm according to claim 1 wherein said novel boat is formed of quartz.

3. Apparatus for counterweighting a diffusion furnace cantilever arm which is inserted into the furnace for processing semiconductor wafers, said apparatus including a novel boat and other boats which contain a full load of wafers where said novel boats provide a means for balancing the cantilever arm, and said novel boat provides a means for balancing with other boats which contain a full load of wafers, said novel boat has a cylindrical outer cover which extends substantially the full length of said novel boat except for slots for receiving wafers that are the same as wafers in other boats and which are less than a full load of wafers therein and said novel boat provides a means for balancing other boats which contain a full load of wafers, and said novel boat contains wafers which is less than a full load and has the same weight as one of said other boats which contain a full load of wafers so that one or more of said novel boats is mounted on a cantilever arm with other boats which contain a full load of wafers as a balancing mechanism.

4. Apparatus for counterweighting a diffusion furnace cantilever arm according to claim 3 wherein said novel boat is formed of quartz.

* * * * *